(12) United States Patent
Tramoni

(10) Patent No.: US 10,727,906 B2
(45) Date of Patent: Jul. 28, 2020

(54) FREQUENCY ADJUSTMENT OF A NFC DEVICE

(71) Applicant: STMicroelectronics (Rousset) SAS, Rousset (FR)

(72) Inventor: Alexandre Tramoni, Le Beausset (FR)

(73) Assignee: STMICROELECTRONICS (ROUSSET) SAS, Rousset (FR)

( * ) Notice: Subject to any disclaimer, the term of this patent is extended or adjusted under 35 U.S.C. 154(b) by 0 days.

(21) Appl. No.: 16/542,747

(22) Filed: Aug. 16, 2019

(65) Prior Publication Data

US 2020/0076476 A1 Mar. 5, 2020

(30) Foreign Application Priority Data

Aug. 31, 2018 (FR) ..................................... 18 57859

(51) Int. Cl.
*H04B 5/00* (2006.01)
*H03K 3/03* (2006.01)
*H02M 7/06* (2006.01)

(52) U.S. Cl.
CPC ............ *H04B 5/0075* (2013.01); *H02M 7/06* (2013.01); *H03K 3/0315* (2013.01)

(58) Field of Classification Search
CPC ...... H04B 5/0075; H02M 7/06; H03K 3/0315
USPC ....................................................... 455/41.1
See application file for complete search history.

(56) References Cited

U.S. PATENT DOCUMENTS

| 6,118,320 A * | 9/2000 | Singyouti | .......... G06K 19/0723 327/291 |
| 2007/0108297 A1 * | 5/2007 | Bates | ................. G06K 19/0707 235/492 |
| 2019/0090957 A1 * | 3/2019 | De Wijs | ............... A61B 8/0841 |

FOREIGN PATENT DOCUMENTS

| EP | 1919079 A1 | 5/2008 |
| WO | 2008044559 A1 | 4/2008 |

\* cited by examiner

*Primary Examiner* — Lee Nguyen
(74) *Attorney, Agent, or Firm* — Slater Matsil, LLP

(57) ABSTRACT

A near-field communication device includes an oscillating circuit, a rectifying bridge configured to rectify a voltage across the oscillating circuit, and a voltage-controlled oscillator configured to supply a reference frequency. The voltage-controlled oscillator is powered and controlled by a voltage that is a function of an output voltage of the rectifying bridge.

20 Claims, 3 Drawing Sheets

FREQUENCY ADJUSTMENT OF A NFC DEVICE

CROSS-REFERENCE TO RELATED APPLICATIONS

This application claims priority to French Patent Application No. 1857859, filed on Aug. 31, 2018, which application is hereby incorporated herein by reference.

TECHNICAL FIELD

The present disclosure generally relates to electronic circuits and, in specific embodiments, to the frequency adjustment of a near field communication (NFC) device.

BACKGROUND

Communication systems comprising electromagnetic transponders are more and more frequent, particularly since the development of near-field communication technologies according to ISO standard 14493 or the NFC forum.

Such systems use a radio frequency electromagnetic field emitted by a device (terminal or reader) to communicate with another device (card).

To optimize the quality of the communication, the resonance frequency of an oscillating circuit of the device detecting a field is generally adjusted (tuned) due to capacitive and/or resistive elements having settable values.

SUMMARY

The present disclosure generally relates to electronic circuits and, in specific embodiments, to electromagnetic transponders, electronic tags (TAG), and other near-field communication devices. Particular embodiments of the present disclosure relate to electronic devices integrating a near field communication (NFC) circuit.

Embodiments address the need to improve near field communication devices, particularly to take into account amplitude variations of the voltage sampled across an oscillating circuit excited by an electromagnetic field.

Embodiments attempt to decrease disadvantages of known near field communication circuits.

An embodiment provides a near field communication device comprising an oscillating circuit, a bridge rectifying the voltage across the oscillating circuit, and a voltage-controlled oscillator supplying a reference frequency. The oscillator is powered and controlled by a voltage that is a function of an output voltage of the rectifying bridge.

According to an embodiment, the device further comprises a circuit of regulation of the output voltage of the rectifying bridge.

According to an embodiment, the device further comprises one or a plurality of digital circuits powered from the output voltage of the rectifying bridge.

According to an embodiment, the oscillator is directly powered and controlled by the voltage supplied by the rectifying bridge.

According to an embodiment, the digital circuit(s) are powered by the circuit of regulation of the output voltage of the rectifying bridge.

According to an embodiment, the oscillator is powered and controlled by the circuit of regulation of the output voltage of the rectifying bridge.

According to an embodiment, the digital circuit(s) are directly powered with the voltage supplied by the rectifying bridge.

According to an embodiment, the regulation circuit regulates the oscillator power supply and control voltage according to the voltage across the oscillating circuit.

According to an embodiment, the device further comprises a circuit for limiting the voltage across the oscillating circuit.

A method of regulating the power consumption of an electromagnetic transponder wherein an operating frequency of the digital circuits of the transponder is a function of a voltage across an oscillating circuit of the transponder.

According to an embodiment, the operating frequency is supplied by an oscillator, voltage-controlled from an output voltage of a bridge rectifying the voltage across the oscillating circuit.

According to an embodiment, the digital circuits are powered with a voltage regulated from the output voltage of the rectifying bridge.

According to an embodiment, the oscillator is directly powered and controlled by the output voltage of the rectifying bridge.

According to an embodiment, the oscillator is powered and controlled by a voltage regulated from the output voltage of the rectifying bridge.

According to an embodiment, the digital circuits are directly powered with the output voltage of the rectifying bridge.

The foregoing and other features and advantages will be discussed in detail in the following non-limiting description of specific embodiments in connection with the accompanying drawings.

DETAILED DESCRIPTION OF ILLUSTRATIVE EMBODIMENTS

Figure 1:
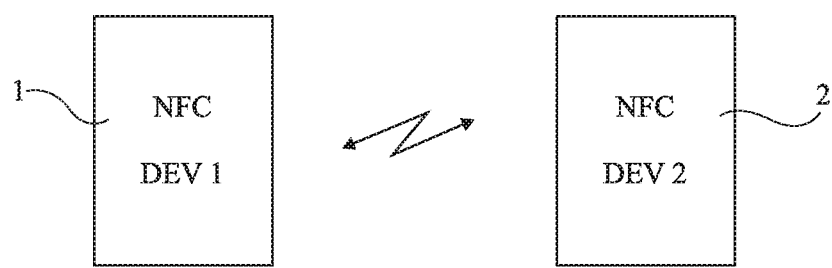
FIG. 1 very schematically shows in the form of blocks an example of a near-field communication system of the type to which the described embodiments apply.

The same elements have been designated with the same reference numerals in the different drawings. In particular, the structural and/or functional elements common to the different embodiments may be designated with the same reference numerals and may have identical structural, dimensional, and material properties.

For clarity, only those steps and elements which are useful to the understanding of the described embodiments have been shown and are detailed. In particular, the applications of near field communication devices have not been detailed, the described embodiments being compatible with usual applications of such devices. Further, since the described embodiments more particularly target the transponder or the device excited by a magnetic field, the operation of the electromagnetic field generation terminal has not been detailed, the described embodiments being compatible with usual operations.

Throughout the present disclosure, the term "connected" is used to designate a direct electrical connection between circuit elements with no intermediate elements other than conductors, whereas the term "coupled" is used to designate an electrical connection between circuit elements that may be direct, or may be via one or more intermediate elements.

In the following description, when reference is made to terms qualifying absolute positions, such as terms "front", "back", "top", "bottom", "left", "right", etc., or relative positions, such as terms "above", "under", "upper", "lower", etc., or to terms qualifying directions, such as terms "horizontal", "vertical", etc., unless otherwise specified, it is referred to the orientation of the drawings.

The terms "about", "substantially", and "approximately" are used herein to designate a tolerance of plus or minus 10%, preferably of plus or minus 5%, of the value in question.

FIG. 1 is a very simplified representation in the form of blocks of an example of a near-field communication system of the type to which the described embodiments apply as an example.

Although the case of two similar electronic devices, for example, two cellular phones, is assumed, all that will be described more generally applies to any system where a transponder detects an electromagnetic field radiated by a reader or terminal. For simplification, reference will be made to NFC devices to designate electronic devices integrating near-field communication circuits.

Two NFC devices 1 (NFC DEV1) and 2 (NFC DEV2) are capable of communicating by near-field electromagnetic coupling. According to applications, for a communication, one of the devices operates in so-called reader mode while the other operates in so-called card mode, or the two devices communicate in peer to peer mode (P2P). Each device comprises various electronic circuits, among which a circuit forming a near-field communication interface, or NFC interface, between the NFC device and the outside. Such an interface is used, among others, in reader mode, to generate a radio frequency signal transmitted by means of an antenna and, in card mode, to decode a captured radio frequency signal. The radio frequency field generated by one of the devices is detected by the other device, which is located within its range and which also comprises an antenna.

For simplification, reference will be made hereafter to a terminal to designate a device emitting an electromagnetic field (for example, an electronic tag readout terminal, an NFC device operating in reader mode, etc.) and to a transponder to designate a device intended to capture this field (for example, an electronic tag, an NFC device operating in card mode, etc.)

A transponder comprises an antenna forming part of an oscillating circuit (for example, a parallel oscillating circuit formed of the antenna and of a capacitive element in parallel) intended to be excited in the presence of an electromagnetic field. The oscillating circuit is generally tuned to an excitation frequency of an oscillating circuit of a terminal intended to generate the electromagnetic field. For example, the oscillating circuits are tuned to a frequency of 13.56 MHz. The communication in the terminal-to-transponder direction is generally achieved by modulation of the amplitude and/or of the phase of the radiofrequency signal generated by the terminal, and thus of the electromagnetic field. The communication in the transponder-to-terminal direction is generally performed by modulation (retromodulation) of the load formed by the circuits of the transponder on the oscillating circuit thereof. For simplification, the amplitude and/or phase detection (demodulation) as well as retromodulation circuits have not been detailed, the described embodiments being compatible with usual demodulation and retromodulation circuits.

In certain applications, the transponder extracts from the electromagnetic field the power necessary for the electronic circuit that it comprises.

One of the operating constraints of a transponder is that the voltage sampled across the oscillating circuit is likely to strongly vary according to the coupling between the antennas of the oscillating circuits of the terminal and of the transponder, the coupling being, among others, a function of the distance separating the oscillating circuits from each other.

Figure 2:
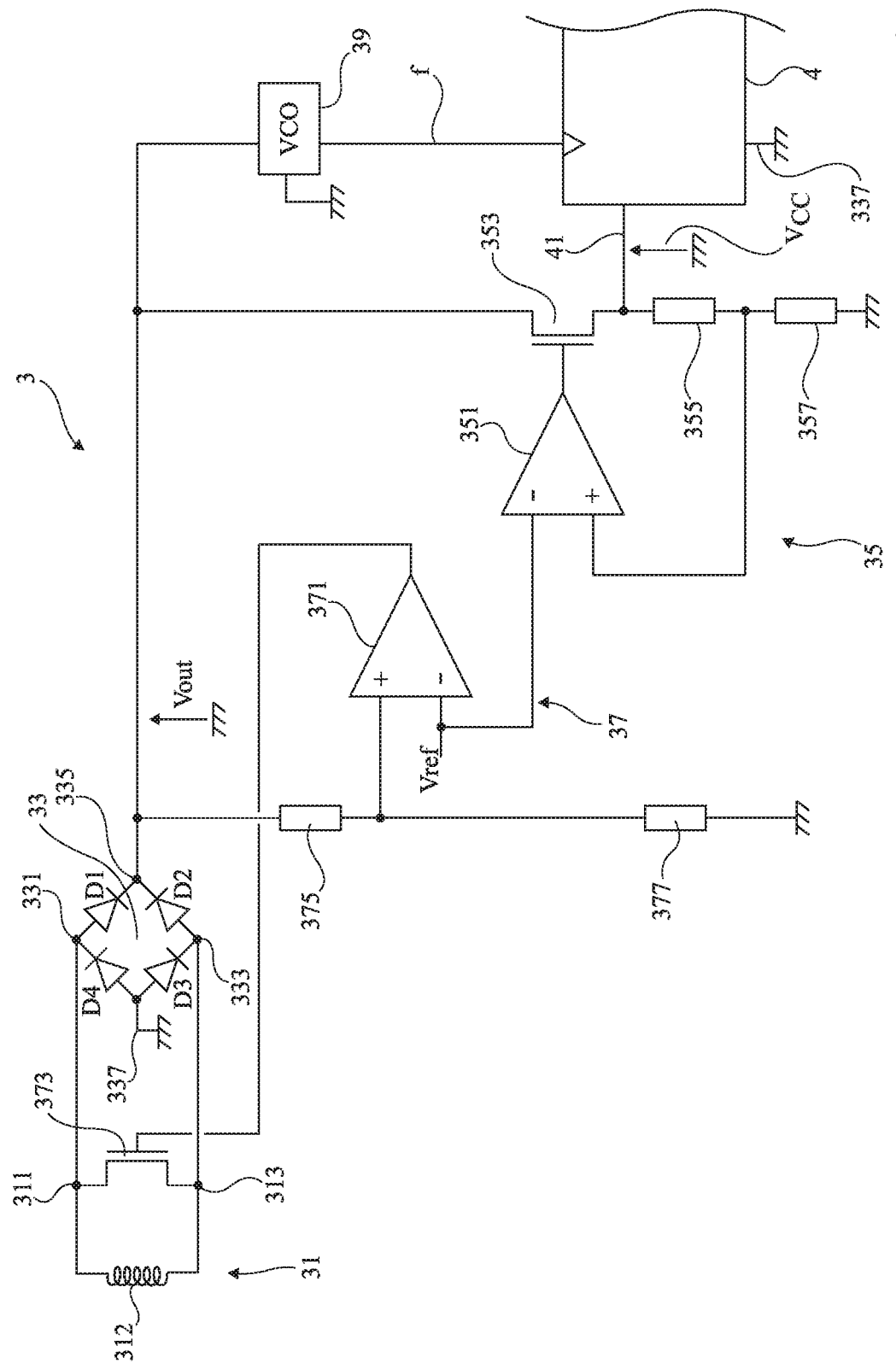
FIG. 2 very schematically shows in the form of blocks an embodiment of a near-field communication device.

FIG. 2 very schematically shows in the form of blocks an embodiment of a near-field communication device 3. This device forms a transponder or the transponder (or card) portion of a mixed device.

Device 3 for example equips one of devices 1 and 2 of FIG. 1, or both.

Transponder 3 comprises an oscillating circuit 31 having an inductive element, formed of an antenna 312, intended to detect an electromagnetic field. In the example of FIG. 2, it is assumed that a capacitive element of the oscillating circuit is formed by stray capacitances. As a variation, a capacitor (for example, having a variable capacitance to adjust the tuning of the oscillating circuit) is connected in parallel with antenna 312.

Terminals 311 and 313 of the oscillating circuit, corresponding to the terminals of antenna 312, are coupled, preferably connected, to the AC input terminals 331 and 333 of a rectifying bridge 33 having rectified output terminals 335 and 337 supplying a DC voltage Vout intended to power the electronic circuits of the transponder. Terminal 337 defines, in the shown example, a reference potential (the ground). A capacitor (not shown) for smoothing voltage Vout is generally present between terminals 335 and 337. Rectifying bridge 33 is, according to embodiments, half-wave or fullwave. In the example of FIG. 2, the case of a fullwave bridge having two diodes D1 and D2 respectively connecting terminals 331 and 333 to terminal 335 with their cathodes on the side of terminal 335, and having two diodes D3 and D4 respectively connecting terminals 331 and 335 to terminal 337 with their anodes on the side of terminal 337, is considered.

Output voltage Vout of rectifying bridge 33 is regulated by a linear regulator 35, or shunt regulator. In the simplified example shown in FIG. 2, regulator 35 is based on an analog comparator 351 of information representative of a voltage Vcc, with respect to a reference voltage Vref. Voltage Vcc forms an output voltage used to power one or a plurality of electronic circuits of the transponder, symbolized by a block 4 in FIG. 2. In the example illustrated in FIG. 2, comparator 351 drives (is coupled to, preferably connected to) the gate of a MOS transistor 353 coupling, preferably connecting, terminal 335 to a terminal 41 supplying potential Vcc (assumed to be referenced with respect to ground 337). An input, for example direct+(non-inverting), of comparator 351 receives information representative of voltage Vcc while its other input (inverting −) receives reference voltage Vref. Reference voltage Vref is for example supplied by a bandgap-type circuit. For example, the junction point of a series association of two resistors 355 and 357, connecting terminals 41 and 337 and forming a resistive dividing bridge, is connected to terminal+ of comparator 351.

Transponder 3 also preferably comprises a circuit 37 of protection against overvoltages. Circuit 37 comprises an analog comparator 371 of information representative of voltage Vout (and thus of the non-regulated voltage) at the output of rectifying bridge 33 with respect to a reference voltage Vref. In the example illustrated in FIG. 2, comparator 371 drives (is coupled to, preferably connected to) the gate of a MOS transistor 373 coupling, preferably connecting, terminals 311 and 313 of the oscillating circuit. An input, for example direct+(non-inverting), of comparator 371 receives information representative of voltage Vcc while its other input (inverting −) receives reference voltage Vref. Reference voltage Vref is for example the same as that used by comparator 351. For example, the junction point of two resistors 375 and 377, connecting terminals 335 and 337 and forming a resistive dividing bridge, is connected to terminal+ of comparator 371. The function of circuit 37 is to modulate the value of the on-state drain-source resistance of transistor 373 to limit (clip) the overvoltage across the antenna to a value selected according to the voltage that the circuits connected downstream can withstand. Thus, only transistor 373 and, possibly, the capacitor of the oscillating circuit, need to withstand overvoltages, the rest of the circuits only seeing a limited voltage. Structurally, circuit 37 has the same structure as a shunt regulator.

According to the applications targeted by the present description, circuits 4 of the transponder comprise, among others, digital circuits driven at a frequency f.

According to the described embodiments, it is provided to adjust operating frequency f of the transponder circuits 4 according to the voltage Vout sampled across the oscillating circuit. Such an adjustment enables to adapt the power consumption of the transponder to the available power. Indeed, the higher the frequency f at which the digital circuits 4 of transponder 3 are driven, the more the circuits consume power and the more they take part in decreasing the overvoltage across oscillating circuit 31. Conversely, decreasing basic operating frequency f of digital circuits 4 of transponder 3 when the voltage sampled across the antenna decreases enables to preserve the remote supply of the transponder with no loss of communication. Thus, adjusting the operating frequency optimizes the efficiency by taking advantage of the maximum possible power while preserving a protection of the circuits against too high voltages. Actually, circuits 4 of transponder 3 form part of the load of oscillating circuit 31. Their power consumption thus has an influence upon the voltage across oscillating circuit 31. Increasing the operating frequency, and thus the power consumption, of circuits 4 decreases the voltage across circuit 31. Less power is thus lost by dissipation in transistor 373 (or other equivalent shunt circuit).

It could have been devised to use the voltage information used by comparator 371 to, via an analog to digital converter, supply a digital set point to a digital clock generation circuit generally comprised in circuits 4. However, this would risk providing an unstable system due to the oscillations that this would introduce downstream of the rectifying bridge between two frequency adjustment times.

According to the described embodiments, it is provided to use a voltage-controlled oscillator 39 (VCO) in analog fashion to supply the basic operating frequency of the circuits 4 or transponder 3. The voltage-controlled oscillator is powered from output voltage Vout of rectifying bridge 33. The frequency f supplied by oscillator 39 forms a basic frequency which may then be divided by the circuits of block 4.

In the embodiment of FIG. 2, the use of a linear regulator 35 (shunt regulator) to supply power supply voltage Vcc of the transponder circuits is combined with the use of an oscillator directly controlled and powered with voltage Vout (non-regulated). This enables to adjust the power consumption of circuits 4 according to the available power and thus optimizes the operation.

Although this has not been illustrated, comparators 351 and 371 may, in the embodiment of FIG. 2, be powered with voltage Vout or with voltage Vcc.

It is further possible to vary the power consumption of circuits 4 by activating certain functions when the available power is sufficient, that is, when frequency f is relatively high (as compared with a value of the frequency under a lower power).

Figure 3:
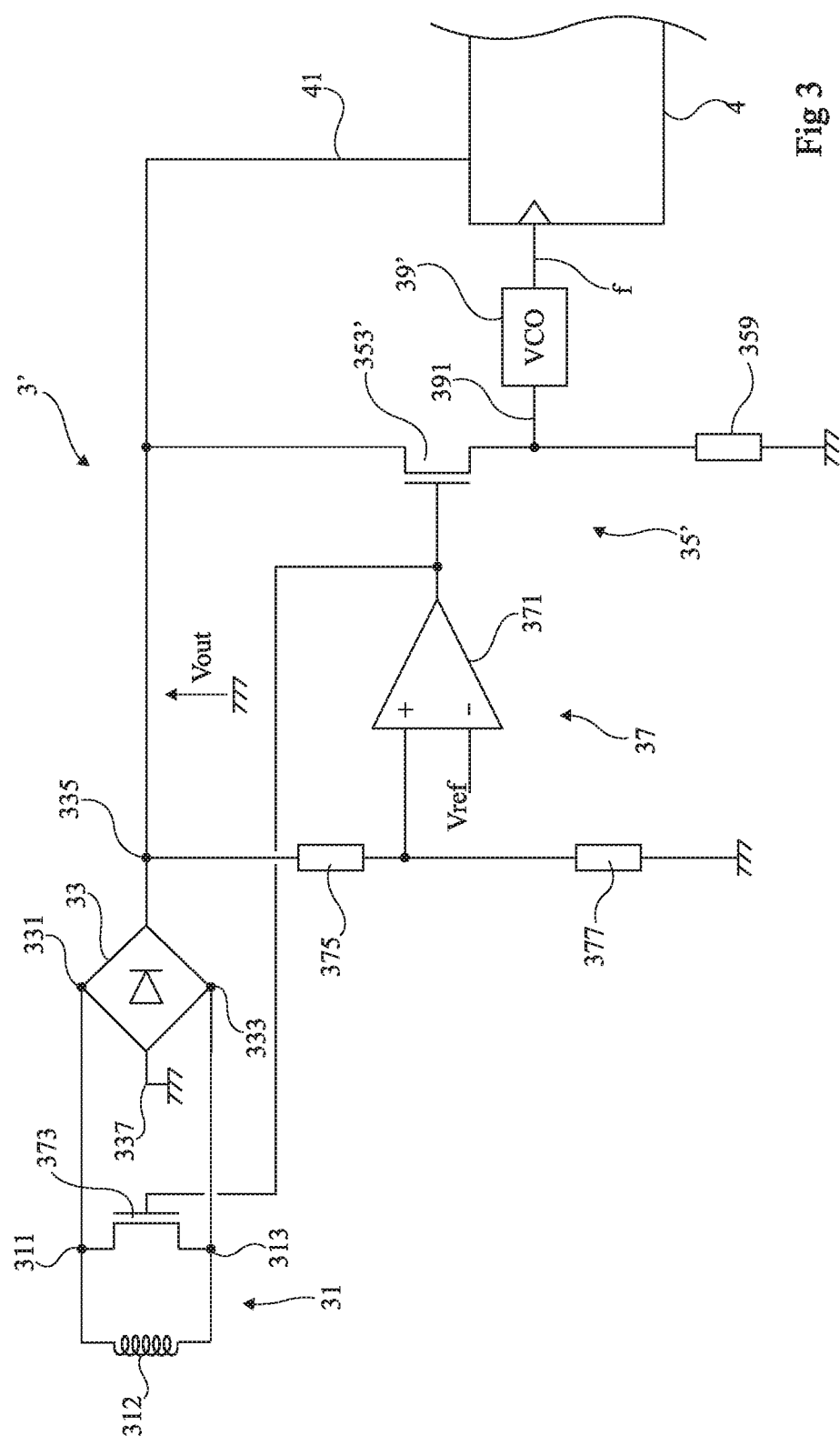
FIG. 3 very schematically shows in the form of blocks another embodiment of a near field communication device.

FIG. 3 very schematically shows in the form of blocks another embodiment of a transponder 3' using a voltage-controlled oscillator to vary basic frequency f of circuits 4 of transponder 3' according to the voltage available at the output of the oscillating circuit.

It shows oscillating circuit 31, rectifying bridge 33, and protection circuit 37.

However, in the embodiment of FIG. 3, circuits 4 are directly powered with output voltage Vout of the rectifying bridge (preferably smoothed by a capacitor, not shown). Thus, terminal 41 is coupled, preferably connected, to terminal 335.

According to this embodiment, the regulation of voltage Vout is directly obtained by varying operating frequency f of the digital circuits of the transponder. Thus, a voltage-controlled oscillator 39', analogically controlled, is controlled and powered by the output of a linear regulator (or shunt regulator) 35'. In the example of FIG. 3, regulator 35' comprises a MOS transistor 353' between terminal 335 and a control and power supply terminal 391 of oscillator 39', and a resistor 359 coupling terminal 391 to ground 337. Transistor 353' is, in the present example, driven by comparator 371 and thus has its gate coupled, preferably connected, to the output of comparator 371.

In this embodiment, the control of oscillator 39' by a shunt regulator 35' enables to indirectly regulate the power supply voltage applied to terminal 41 by the operating frequency.

As a variation, another comparator (not shown) is provided to control transistor 353' by sampling information from voltage Vout to control it.

In the example of FIG. 3, rectifying bridge 33 is symbolized by a block. It may be, as in FIG. 2, halfwave or fullwave.

An advantage of the described embodiments is that they take advantage from a lower power consumption of a voltage controlled oscillator as compared with that of an analog to-digital converter.

Another advantage of the described embodiments is that they are compatible with an operation of the transponder in different power modes.

Another advantage of the described embodiments is that, while optimizing the power consumption of the transponder, the protection function provided by circuit 37 is preserved.

Different types of voltage-controlled oscillators may be used for oscillator 39 or 39'. Preferably, a ring oscillator, which has the advantage of simplicity and of avoiding the use of an inductive component, is used.

Various embodiments and variations have been described. It will be understood by those skilled in the art that certain features of these various embodiments and variations may be combined, and other variations will occur to those skilled in the art. In particular, the selection of the operating frequencies of the transponder depends on the application.

Finally, the practical implementation of the described embodiments and variations is within the abilities of those skilled in the art based on the functional indications given hereinabove. In particular, other assemblies for supplying the control (or power supply) voltage of the voltage-controlled oscillator may be provided, provided for this voltage to be a function of the voltage across oscillating circuit 31.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A near-field communication device comprising:
an oscillating circuit comprising an antenna;
a rectifying bridge configured to rectify a voltage across the oscillating circuit; and
a voltage-controlled oscillator configured to supply a reference frequency, wherein the voltage-controlled oscillator is powered and controlled by a voltage that is a function of an output voltage of the rectifying bridge; and
a voltage-limiting circuit directly coupled across terminals of the antenna.

2. The device of claim 1, further comprising a regulation circuit for the output voltage of the rectifying bridge.

3. The device of claim 2, wherein the voltage-controlled oscillator is powered and controlled by the regulation circuit.

4. The device of claim 3, further comprising a digital circuit directly powered with the voltage supplied by the rectifying bridge.

5. The device of claim 3, wherein the regulation circuit is configured to regulate a power supply and to control a voltage of the voltage-controlled oscillator according to the voltage across the voltage-controlled oscillator.

6. The device of claim 1, further comprising a digital circuit powered by the output voltage of the rectifying bridge.

7. The device of claim 1, further comprising a plurality of digital circuits powered by the output voltage of the rectifying bridge.

8. The device of claim 1, wherein the voltage-controlled oscillator is directly powered and controlled by the output voltage of the rectifying bridge.

9. The device of claim 1, further comprising a regulation circuit for the output voltage of the rectifying bridge and a digital circuit powered by the output voltage of the rectifying bridge, wherein the digital circuit is powered by the regulation circuit.

10. A near-field communication device comprising:
an oscillating circuit;
a rectifying bridge coupled across terminals of the oscillating circuit;
a regulation circuit coupled to an output of the rectifying bridge;
a voltage-controlled oscillator having an input coupled to the regulation circuit; and
a digital near-field communication circuit having a clock terminal coupled to an output of the voltage-controlled oscillator and a supply voltage terminal coupled to the regulation circuit, wherein the regulation circuit comprises:
a comparator having a first input and a second input, the first input coupled to a reference voltage node;
a transistor having a control terminal coupled to an output of the comparator, the transistor having a current path coupled between the output of the rectifying bridge and the supply voltage terminal of the digital near-field communication circuit;
a first resistor coupled between the supply voltage terminal of the digital near-field communication circuit and the second input of the comparator; and
a second resistor coupled between the second input of the comparator and a reference voltage terminal.

11. The device of claim 10, further comprising a voltage-limiting circuit coupled across output terminals of the oscillating circuit.

12. The device of claim 10, further comprising:
a second comparator having a first input and a second input, the first input coupled to the reference voltage node;
a second transistor having a current path coupled across terminals of the oscillating circuit, the second transistor having a control terminal coupled to the output of the second comparator;
a third resistor coupled between the output of the rectifying bridge and the second input of the second comparator; and
a fourth resistor coupled between the second input of the second comparator and the reference voltage terminal.

13. A method of regulating power consumption of an electromagnetic transponder, the method comprising:
receiving an oscillating signal from an antenna, the oscillating signal having a voltage amplitude; and
operating digital circuits of the transponder at an operating frequency that is a function of the voltage amplitude of the oscillating signal;
determining that the voltage amplitude is in an overvoltage condition; and
directly connecting together terminals of the antenna during the overvoltage condition.

14. The method of claim 13, further comprising rectifying the oscillating signal and controlling a voltage-controlled oscillator using the rectified oscillating signal, the voltage-controlled oscillator generating a signal at the operating frequency.

15. The method of claim 14, wherein operating the digital circuits comprises powering the digital circuits by a voltage regulated from the rectified oscillating signal.

16. The method of claim 14, wherein operating the digital circuits comprises directly powering the digital circuits by a voltage regulated from the rectified oscillating signal.

17. The method of claim 14, wherein controlling the voltage-controlled oscillator comprises powering and controlling the voltage-controlled oscillator by a voltage regulated from the rectified oscillating signal.

18. The method of claim 14, wherein controlling the voltage-controlled oscillator comprises directly powering and controlling the voltage-controlled oscillator by a voltage regulated from the rectified oscillating signal.

19. A near-field communication device comprising:
an oscillating circuit;
a rectifying bridge coupled across terminals of the oscillating circuit;
a regulation circuit coupled to an output of the rectifying bridge;
a voltage-controlled oscillator having an input coupled to the regulation circuit; and
a digital near-field communication circuit having a clock terminal coupled to an output of the voltage-controlled oscillator and a supply voltage terminal coupled to the regulation circuit, wherein the regulation circuit comprises:
a comparator having a first input and a second input, the first input coupled to a reference voltage node;

a transistor having a control terminal coupled to an output of the comparator, the transistor having a current path coupled between the output of the rectifying bridge and the input of the voltage-controlled oscillator;
a first resistor coupled between the input of the voltage-controlled oscillator and a reference voltage terminal;
a second resistor coupled between the output of the rectifying bridge and the second input of the comparator; and
a third resistor coupled between the second input of the comparator and the reference voltage terminal.

20. The device of claim 19, further comprising a second transistor having a current path coupled across terminals of the oscillating circuit, the second transistor having a control terminal coupled to the output of the comparator.

* * * * *